United States Patent
Kaneko et al.

(10) Patent No.: US 12,540,416 B2
(45) Date of Patent: Feb. 3, 2026

(54) METHOD FOR MANUFACTURING A SEMICONDUCTOR SUBSTRATE AND METHOD FOR SUPPRESSING OCCURRENCE OF CRACKS IN A GROWTH LAYER

(71) Applicants: KWANSEI GAKUIN EDUCATIONAL FOUNDATION, Hyogo (JP); TOYOTA TSUSHO CORPORATION, Aichi (JP)

(72) Inventors: Tadaaki Kaneko, Sanda (JP); Daichi Dojima, Sanda (JP)

(73) Assignees: KWANSEI GAKUIN EDUCATIONAL FOUNDATION, Hyogo (JP); TOYOTA TSUSHO CORPORATION, Aichi (JP)

( * ) Notice: Subject to any disclaimer, the term of this patent is extended or adjusted under 35 U.S.C. 154(b) by 619 days.

(21) Appl. No.: 17/996,091

(22) PCT Filed: Mar. 30, 2021

(86) PCT No.: PCT/JP2021/013743
§ 371 (c)(1),
(2) Date: Oct. 13, 2022

(87) PCT Pub. No.: WO2021/210390
PCT Pub. Date: Oct. 21, 2021

(65) Prior Publication Data
US 2023/0203704 A1    Jun. 29, 2023

(30) Foreign Application Priority Data

Apr. 14, 2020    (JP) .................................. 2020-072547

(51) Int. Cl.
*C30B 23/02*    (2006.01)
*C30B 23/06*    (2006.01)
(Continued)

(52) U.S. Cl.
CPC .......... *C30B 23/025* (2013.01); *C30B 23/063* (2013.01); *C30B 29/403* (2013.01);
(Continued)

(58) Field of Classification Search
CPC ....... C30B 23/00; C30B 23/02; C30B 23/025; C30B 23/04; C30B 23/06; C30B 23/063;
(Continued)

(56) References Cited

U.S. PATENT DOCUMENTS

| | | | |
|---|---|---|---|
| 6,579,359 B1 * | 6/2003 | Mynbaeva | ............ C30B 29/406 |
| | | | 257/E21.127 |
| 2006/0046511 A1 | 3/2006 | Shibata et al. | |
| 2019/0057865 A1 | 2/2019 | Oshima et al. | |
| 2019/0136409 A1 * | 5/2019 | Kaneko | ................. C30B 35/002 |
| 2021/0032772 A1 | 2/2021 | Ghyselen | |
| 2023/0197486 A1 * | 6/2023 | Kaneko | ................... C30B 33/08 |
| | | | 257/77 |

FOREIGN PATENT DOCUMENTS

| | | |
|---|---|---|
| JP | 2000-311903 A | 11/2000 |
| JP | 2003-229623 A | 8/2003 |

(Continued)

OTHER PUBLICATIONS

English translation of International Search Report from PCT/JP2021/013743 dated Jun. 15, 2021 (2 pages).
(Continued)

*Primary Examiner* — Kenneth A Bratland, Jr.
(74) *Attorney, Agent, or Firm* — Calfee, Halter & Griswold LLP

(57) ABSTRACT

An object of the present invention is to provide a novel technique capable of suppressing the occurrence of cracks in the growth layer.
The present invention is a method for manufacturing a semiconductor substrate, which includes: an embrittlement processing step S10 of reducing strength of an underlying substrate 10; and a crystal growth step S20 of forming the growth layer 20 on the underlying substrate 10. In addition, the present invention is a method for suppressing the occur-
(Continued)

rence of cracks in the growth layer 20, and this method includes an embrittlement processing step S10 of reducing the strength of the underlying substrate 10 before forming the growth layer 20 on the underlying substrate 10.

12 Claims, 8 Drawing Sheets

(51) Int. Cl.
*C30B 29/40* (2006.01)
*H01L 21/02* (2006.01)

(52) U.S. Cl.
CPC .... *H01L 21/02378* (2013.01); *H01L 21/0243* (2013.01); *H01L 21/02458* (2013.01); *H01L 21/02631* (2013.01)

(58) Field of Classification Search
CPC ....... C30B 23/066; C30B 29/00; C30B 29/10; C30B 29/40; C30B 29/403; H01L 21/02378; H01L 21/0243; H01L 21/02458; H01L 21/02631
USPC ................. 117/84, 88, 94, 106, 937, 952
See application file for complete search history.

(56) References Cited

FOREIGN PATENT DOCUMENTS

| JP | 2013-179121 A | 9/2013 | |
|----|----|----|----|
| JP | 2015131744 A | 7/2015 | |
| JP | 2019-026500 A | 2/2019 | |
| WO | WO-2016147786 A1 * | 9/2016 | ............. C30B 29/38 |
| WO | WO-2017188381 A1 * | 11/2017 | ............. C30B 23/06 |
| WO | 2019/186266 A | 10/2019 | |

OTHER PUBLICATIONS

Kamber et al., "Lateral epitaxial overgrowth of aluminum nitride on patterned silicon carbide substrates by hydride vapor phase epitaxy", Applied Physics Letter (2007), vol. 90, No. 12, pp. 122116-1-122116-3.

Lossy et al., "Gallium nitride powerbar transistors with via holes fabricated by laser ablation" , Physic Status Solidi. C: Current Topics in Solid State Physics (2006), vol. 3, No. 3, pp. 482-485.

EPO Communication and European Search Report issued in corresponding EP application No. 21788428.7 on Apr. 22, 2024 (8 pages).

* cited by examiner (a)

(b)

(a)

(b)

(c)

(a)

(b)

METHOD FOR MANUFACTURING A SEMICONDUCTOR SUBSTRATE AND METHOD FOR SUPPRESSING OCCURRENCE OF CRACKS IN A GROWTH LAYER

CROSS-REFERENCE TO RELATED APPLICATIONS

This application is a 371 of PCT Application No. PCT/JP2021/013743, filed on Mar. 30, 2021, which claims priority to Japanese Application No. 2020-072547, filed on Apr. 14, 2020, the contents of which are hereby incorporated by reference as if recited in their entirety.

TECHNICAL FIELD

The present invention relates to a method for manufacturing a semiconductor substrate, a semiconductor substrate, and a method for suppressing occurrence of cracks in a growth layer.

BACKGROUND ART

Conventionally, in manufacturing a semiconductor substrate, a semiconductor substrate of a desired semiconductor material is manufactured by crystal-growing a semiconductor material (a so-called heteroepitaxial growth) that is different from an underlying substrate on the underlying substrate.

However, in the heteroepitaxial growth, it has been regarded as a problem that occurrence of cracks, occurrence of dislocations, deterioration of surface morphology, warpage of the substrate, and the like, in a growth layer are present due to difference in lattice constant and thermal expansion coefficient between the two materials.

In order to solve such problems as the occurrence of cracks in the growth layer, an intermediate layer (a so-called buffer layer) that absorbs stress due to a lattice constant difference or a thermal expansion coefficient difference is formed between the underlying substrate and the growth layer.

For example, Patent Literature 1 discloses a two-step growth method in which a low-temperature growth layer is formed prior to formation of a compound semiconductor layer in order to absorb stress and crystal defects due to the lattice constant difference and the thermal expansion coefficient difference between a Si substrate and a compound semiconductor.

In addition, Patent Literature 2 discloses a technique of inserting an aluminum nitride (AlN) layer as the buffer layer between a silicon carbide (SiC) layer and a gallium nitride (GaN) layer.

CITATION LIST

Patent Literature

Patent Literature 1: JP 2000-311903 A
Patent Literature 2: JP 2013-179121 A

SUMMARY OF INVENTION

Technical Problem

The occurrence of cracks in the growth layer described above can also occur when the same semiconductor material as the underlying substrate is crystal-grown (a so-called homoepitaxial growth) on the underlying substrate. In other words, when doping concentration is different between the underlying substrate and the growth layer, cracks may occur due to a difference in the lattice distance between the underlying substrate and the growth layer.

An object of the present invention is to provide a novel technique capable of suppressing the occurrence of cracks in the growth layer.

Solution to Problem

The present invention that is intended to solve the problems described above is a method for manufacturing a semiconductor substrate, which includes: an embrittlement processing step of reducing strength of an underlying substrate; and a crystal growth step of forming the growth layer on the underlying substrate.

As described above, by including the embrittlement processing step of reducing the strength of the underlying substrate, the stress generated in the growth layer can be released to the underlying substrate, and the occurrence of cracks in the growth layer can be suppressed.

In a preferred mode of the present invention, the crystal growth step is a step of forming the growth layer having a shrinkage rate different from that of the underlying substrate.

According to the present invention, the stress generated by the difference in shrinkage rate between the underlying substrate and the growth layer is released to the underlying substrate side, so that occurrence of cracks on the growth layer side can be suppressed.

In a preferred mode of the present invention, the underlying substrate and the growth layer have different doping concentrations.

According to the present invention, it is possible to suppress the occurrence of cracks caused by the difference in the doping concentrations between the underlying substrate and the growth layer. In other words, in the homoepitaxial growth, the occurrence of cracks in the growth layer can be suppressed.

In a preferred mode of the present invention, the underlying substrate and the growth layer are made of different materials.

According to the present invention, it is possible to suppress the occurrence of cracks caused by a difference in physical properties (the lattice constant and the thermal expansion coefficient) between the semiconductor material of the underlying substrate and the semiconductor material of the growth layer. In other words, in the heteroepitaxial growth, the occurrence of cracks in the growth layer can be suppressed.

In a preferred mode of the present invention, the embrittlement processing step includes a through hole formation step of forming through holes in the underlying substrate, and a strained layer removal step of removing a strained layer introduced in the through hole formation step.

In a preferred mode of the present invention, the through hole formation step is a step of forming the through holes by irradiating the underlying substrate with a laser.

In a preferred mode of the present invention, the strained layer removal step is a step of etching the underlying substrate by heat treatment.

In a preferred mode of the present invention, the underlying substrate is silicon carbide, and the strained layer removal step is a step of etching the underlying substrate under a silicon atmosphere.

In a preferred mode of the present invention, the crystal growth step is a step of growing via a physical vapor transport method.

Furthermore, the present invention also relates to a method for suppressing the occurrence of cracks in the growth layer. In other words, the present invention that is intended to solve the problems described above is a method for suppressing the occurrence of cracks in the growth layer, and this method includes an embrittlement processing step of reducing the strength of the underlying substrate before forming the growth layer on the underlying substrate.

In a preferred mode of the present invention, the embrittlement processing step includes a through hole formation step of forming through holes in the underlying substrate, and a strained layer removal step of removing a strained layer introduced in the through hole formation step.

In a preferred mode of the present invention, the strained layer removal step is a step of removing the strained layer of the underlying substrate by heat treatment.

In a preferred mode of the present invention, the underlying substrate is silicon carbide, and the strained layer removal step is a step of etching the underlying substrate under a silicon atmosphere.

Advantageous Effects of Invention

According to the technique disclosed, it is possible to provide a novel technique capable of suppressing the occurrence of cracks in the growth layer.

Other problems, features and advantages will become apparent by reading the following description of embodiments as well as understanding the drawings and claims.

DESCRIPTION OF EMBODIMENTS

Figure 1:
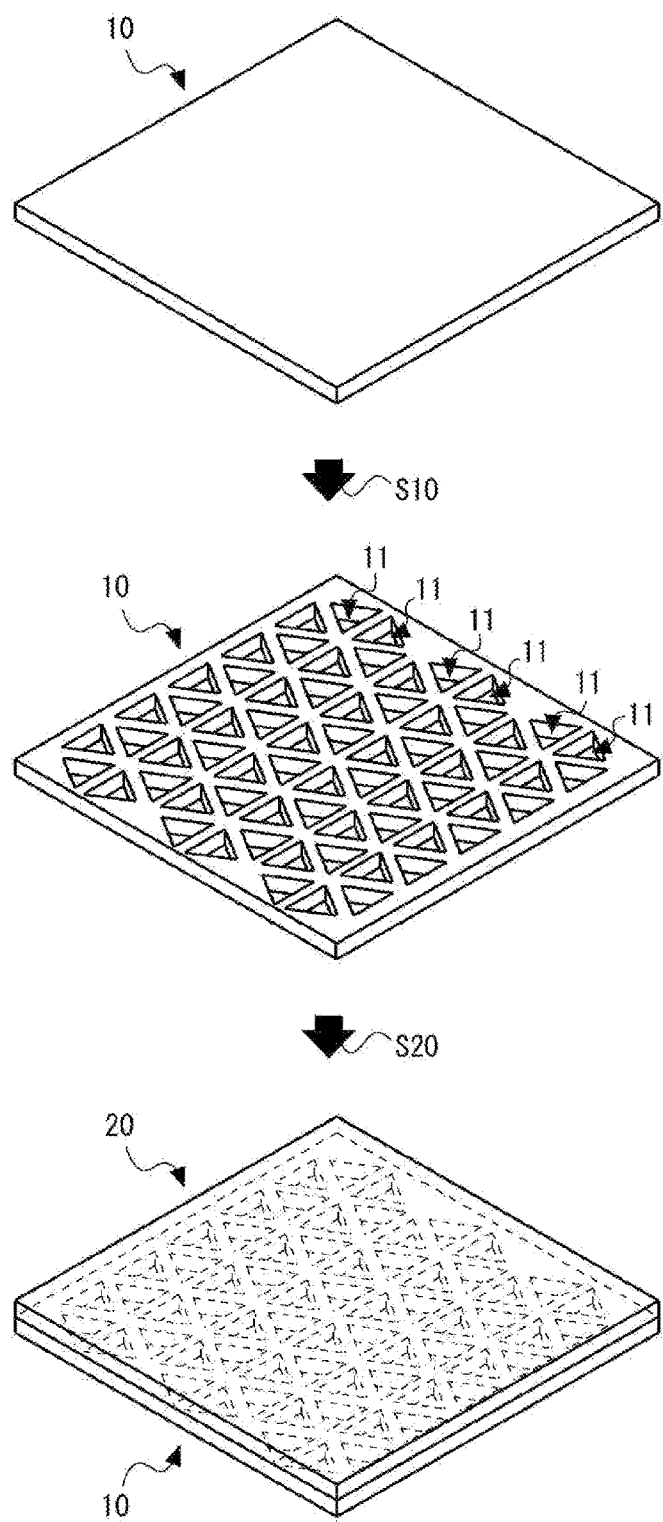
FIG. 1 is an explanatory view for explaining steps of a method for manufacturing a semiconductor substrate according to an embodiment.

Hereinafter, preferred embodiments of a method for manufacturing a semiconductor substrate according to the present invention will be described in detail with reference to the accompanying drawings. The technical scope of the present invention is not limited to the embodiments illustrated in the accompanying drawings, and can be appropriately changed within the scope described in the claims. Furthermore, the accompanying drawings are conceptual diagrams, and the relative dimensions and the like of each member do not limit the present invention. Moreover, in the present description, for the purpose of describing the invention, upper side or lower side may be referred to as the upper or the lower side based on the upper and lower sides of the drawings, but the upper and lower sides are not limited in relation to usage modes or the like of the semiconductor substrate of the present invention. In addition, in the following description of the embodiments and the accompanying drawings, the same reference numerals are given to the same configurations, and redundant description is omitted.

Method for Manufacturing Semiconductor Substrate

Figure 2:
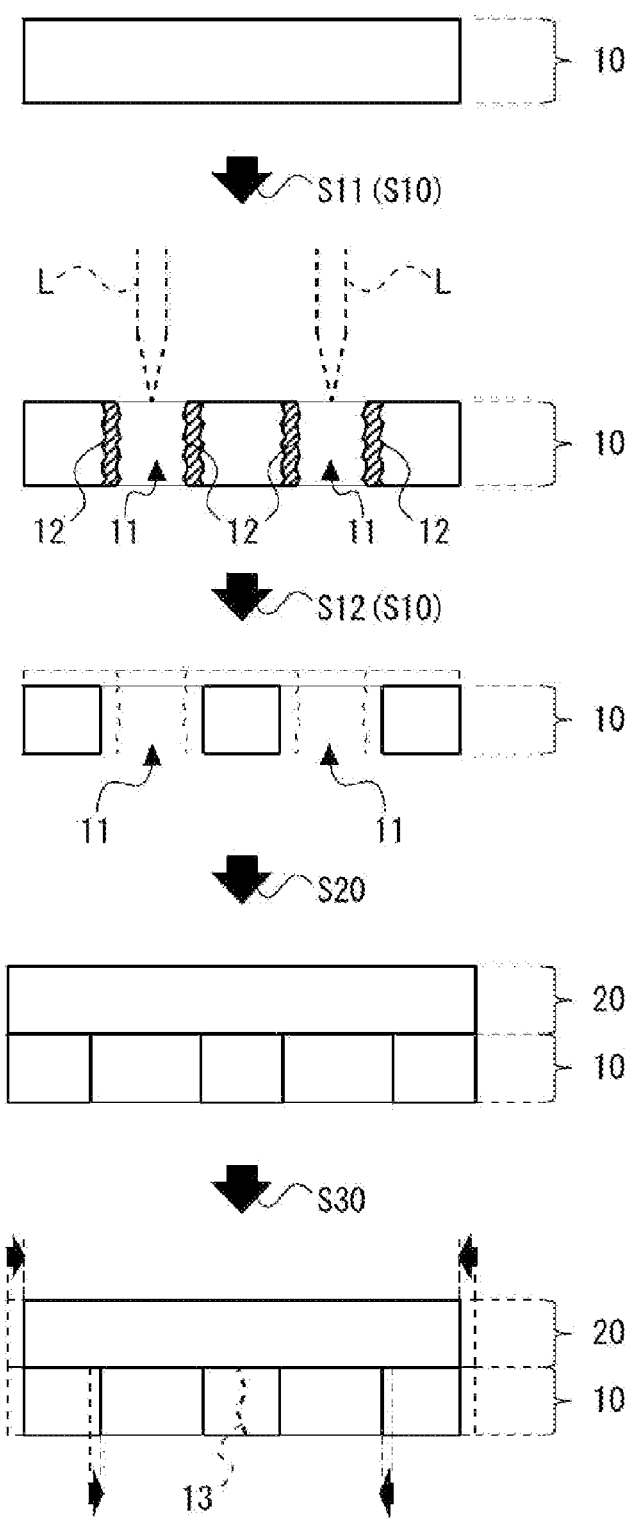
FIG. 2 is an explanatory view for explaining steps of the method for manufacturing a semiconductor substrate according to the embodiment.

FIGS. 1 and 2 illustrate steps of a method for manufacturing a semiconductor substrate according to the embodiment of the present invention.

The method for manufacturing the semiconductor substrate according to the embodiment may include an embrittlement processing step S10 of reducing the strength of an underlying substrate 10, a crystal growth step S20 of forming a growth layer 20 on the underlying substrate 10, and a temperature lowering step S30 of lowering the temperatures of the underlying substrate 10 and the growth layer 20 after the crystal growth step S20.

In addition, this embodiment can be understood as a method for suppressing the occurrence of cracks in the growth layer 20 by including the embrittlement processing step S10 for reducing the strength of the underlying substrate 10 before forming the growth layer 20 on the underlying substrate 10.

Hereinafter, each step of the embodiment will be described in detail.

Embrittlement Processing Step

The embrittlement processing step S10 is a step of reducing the strength of the underlying substrate 10. In other words, the embrittlement processing step S10 is a step of processing the underlying substrate 10 in such a way to be easily deformed or broken by an external force. Furthermore, in other words, the embrittlement processing step S10 is a step of increasing the brittleness of the underlying substrate 10. In addition, the "strength" in the present description refers to a durability against a physical external force such as compression or tension, and includes a concept of mechanical strength.

The embrittlement processing step S10 according to the embodiment reduces the strength of the underlying substrate 10 by forming through holes 11 in the underlying substrate 10. In other words, by reducing the volume of the underlying substrate 10, processing is performed in such a way that the underlying substrate can be easily deformed or broken by an external force.

More specifically, the embrittlement processing step S10 includes a through hole formation step S11 of forming the through holes 11 in the underlying substrate 10, and a strained layer removal step S12 of removing a strained layer 12 introduced in the through hole formation step S11.

The underlying substrate 10 can be naturally adopted as long as it is a material generally used in manufacturing semiconductor substrates. The material of the underlying substrate 10 is, for example, a known group IV material such as silicon (Si), germanium (Ge), or diamond (C). Furthermore, the material of the underlying substrate 10 is, for example, a known group IV-IV compound material such as silicon carbide (SiC). Moreover, the material of the underlying substrate 10 is a known group II-VI compound material such as zinc oxide (ZnO), zinc sulfide (ZnS), zinc selenide (ZnSe), cadmium sulfide (CdS), or cadmium telluride (CdTe). And the material of the underlying substrate 10 is, for example, a known group III-V compound material such as boron nitride (BN), gallium arsenide (GaAs), gallium nitride (GaN), aluminum nitride (AlN), indium nitride (InN), gallium phosphide (GaP), indium phosphide (InP), or indium antimonide (InSb). Furthermore, the material of the underlying substrate 10 is, for example, an oxide material such as aluminum oxide ($Al_2O_3$) or gallium oxide ($Ga_2O_3$). Moreover, the material of the underlying substrate 10 is, for example, a metal material such as copper (Cu) or nickel (Ni). Note that the underlying substrate 10 may have a configuration in which a known additive atom to be used according to the material is appropriately added.

In addition, as the underlying substrate 10, a wafer or a substrate processed from a bulk crystal may be used, or a substrate having a buffer layer made of the semiconductor material described above may be separately used.

The through hole formation step S11 is a step of reducing the strength of the underlying substrate 10 by forming the through holes 11 in the underlying substrate 10. The through hole formation step S11 can be naturally adopted as long as it is a method capable of forming the through holes 11 in the underlying substrate 10.

As a method of forming the through holes 11, a plasma etching such as a laser processing, a focused ion beam system (FIB), and a reactive ion etching (RIE) can be adopted as an example. In addition, in FIG. 2 illustrating the present embodiment, a means for forming the through holes 11 by irradiating the underlying substrate 10 with a laser L is illustrated.

A shape that reduces the strength of the underlying substrate 10 may be adopted for the through holes 11, and one or a plurality of through holes may be formed. In addition, a through hole group (pattern) in which a plurality of through holes 11 are arranged may be adopted.

Hereinafter, an example of a pattern when a hexagonal semiconductor material is grown will be described in detail.

Figure 3:
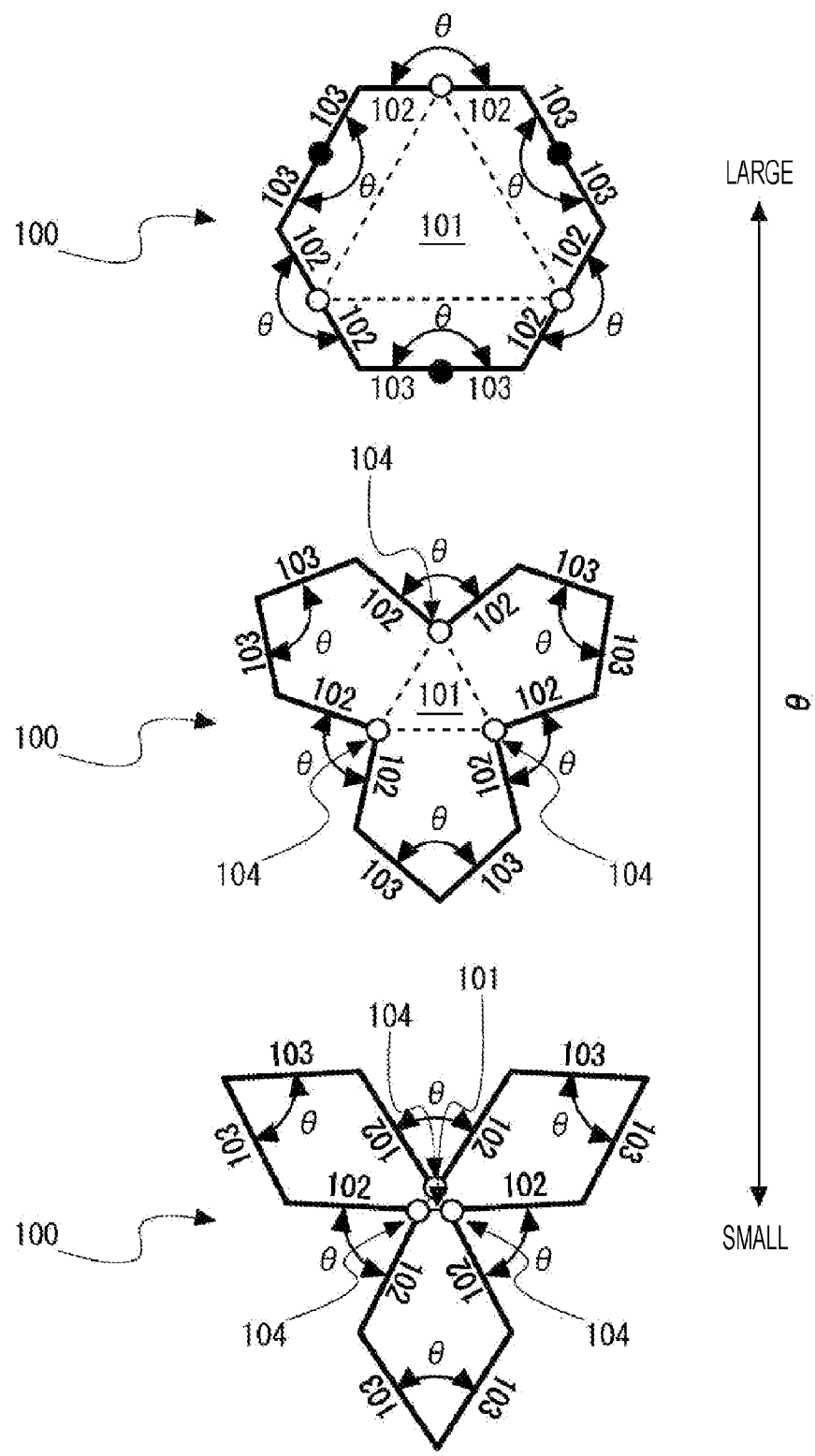
FIG. 3 is an explanatory view of a through hole formation step according to the embodiment.

FIG. 3 is an explanatory view for explaining a pattern 100 according to the embodiment. A line segment indicated by the pattern 100 is the underlying substrate 10. The pattern 100 preferably presents a regular hexagonal displacement shape that is three-fold symmetric. The "regular hexagonal displacement shape" in the description of the present description will be described in detail below with reference to FIG. 3. The regular hexagonal displacement shape is a 12 polygon. Furthermore, the regular hexagonal displacement shape is constituted by 12 straight line segments having the same length. The pattern 100 having the regular hexagonal displacement shape includes a reference FIG. 101 which is regular triangle having an area 101a and including three vertices 104. Each of the three vertices 104 is included in the vertices of the pattern 100. Here, it can be understood that the three vertices 104 may be located on a line segment constituting the pattern 100. The pattern 100 includes line segments 102 (corresponding to first line segments) extending from the vertices 104 and including the vertices 104, and line segments 103 (corresponding to second line segments) not extending from the vertices 104, not including the vertices 104, and adjacent to the line segments 102. Here, an angle θ formed by two adjacent line segments 102 in the pattern 100 is constant and is equal to an angle θ formed by two adjacent line segments 103 in the pattern 100. Furthermore, the "regular hexagonal displacement shape" in the description of the present description can be understood as a 12 polygon in which the regular hexagon is displaced (deformed) while maintaining the area of the regular hexagon based on the angle θ indicating a degree of unevenness.

The angle θ is preferably more than 60°, preferably 66° or more, preferably 80° or more, preferably 83° or more, preferably 120° or more, preferably 150° or more, and preferably 155° or more. In addition, the angle θ is preferably 180° or less, preferably 155° or less, preferably 150° or less, preferably 120° or less, preferably 83° or less, preferably 80° or less, and preferably 66° or less.

The pattern 100 according to the embodiment may be configured to have a regular 12 polygonal displacement shape that is six-fold symmetric instead of the regular hexagonal displacement shape that is three-fold symmetric. The regular 12 polygonal displacement shape is a 24 polygon. Moreover, the regular 12 polygonal displacement shape is constituted by 24 straight line segments having the same length. The pattern 100 having the regular 12 polygonal displacement shape includes a reference FIG. 101 which is regular hexagon having an area 101a and including six vertices 104. Each of the six vertices 104 is included in the vertices of the pattern 100. Moreover, similarly to the regular hexagonal displacement shape, an angle θ formed by two adjacent line segments 102 in the pattern 100 is constant and is equal to an angle θ formed by two adjacent line segments 103 in the pattern 100. In other words, the "regular 12 polygonal displacement shape" in the description of the present description can be understood as a 24 polygon in which the regular 12 polygon is displaced (deformed) while maintaining the area of the regular 12 polygon based on the angle θ indicating the degree of unevenness. In addition, the pattern 100 may have a 2n-gonal displacement shape that is a 4n-gonal shape in which a regular 2n-gonal shape is displaced (deformed) while maintaining the area of the regular 2n-gonal shape based on an angle θ indicating the degree of unevenness. At this time, it can be understood that the 2n-gonal displacement shape includes a regular n-gonal shape (corresponding to the reference FIG. 101). Here, it can be understood that the reference FIG. 101 includes n vertices.

The pattern 100 according to the embodiment may be configured to include a regular 2n-gonal displacement shape (the regular hexagonal displacement shape and the regular 12 polygonal displacement shape are included). Furthermore, the pattern 100 may be configured to further include at least one line segment (corresponding to a third line segment) connecting an intersection of two adjacent line segments 103 in the regular 2n-gonal displacement shape and the center of gravity of the reference FIG. 101, in addition to the line segment constituting the regular 2n-gonal displacement shape. Moreover, the pattern 100 may be configured to further include at least one line segment connecting an intersection of two adjacent line segments 103 in the regular 2n-gonal displacement shape and the vertices 104 constituting the reference FIG. 101, in addition to the line segment constituting the regular 2n-gonal displacement shape. In addition, the pattern 100 may further include at least one line segment constituting the reference FIG. 101 included in the regular 2n-gonal displacement shape, in addition to the line segment constituting the regular 2n-gonal displacement shape.

In addition, the through hole formation step S11 is preferably a step of removing 50% or more of an effective area of the underlying substrate 10. Furthermore, the step of removing 60% or more of the effective area is more preferable, the step of removing 70% or more of the effective area is further preferable, and the step of removing 80% or more of the effective area is still more preferable.

Moreover, the effective area in the present description refers to the surface of the underlying substrate 10 to which the source adheres in the crystal growth step S20. In other words, it refers to a remaining region other than a region removed by the through holes 11 on the growth surface of the underlying substrate 10.

Furthermore, the effective area of the underlying substrate 10 and the shape/pattern of the through holes 11 are desirably set in consideration of the lattice constant difference and the thermal expansion coefficient difference between the underlying substrate 10 and the growth layer 20, and a crystal structure and a growth method of the growth layer 20.

The strained layer removal step S12 is a step of removing the strained layer 12 formed on the underlying substrate 10 in the through hole formation step S11. This strained layer removal step S12 can be naturally adopted as long as it is a means capable of removing the strained layer 12 introduced into the underlying substrate 10.

As a method of removing the strained layer 12, for example, a hydrogen etching method using hydrogen gas as an etching gas, a Si-vapor etching (SiVE) method of heating under a Si atmosphere, or an etching method described in Example 1 to be described later can be adopted.

Crystal Growth Step

The crystal growth step S20 is a step of forming the growth layer 20 on the underlying substrate 10 after the embrittlement processing step S10.

The semiconductor material of the growth layer 20 may be the same semiconductor material as that of the underlying substrate 10 (the homoepitaxial growth) or may be a semiconductor material different from that of the underlying substrate 10 (the heteroepitaxial growth). In addition, a case where the semiconductor material of the growth layer 20 is lower in strength than the semiconductor material of the underlying substrate 10 can be exemplified.

As a material of the growth layer 20, in general, any material that is epitaxially grown as a semiconductor material can be naturally adopted. The material of the growth layer 20 may be the material of the underlying substrate 10, may be a known material that can be adopted for the material of the underlying substrate 10, or may be a known material that can be epitaxially grown on the underlying substrate 10.

Specifically, as a material of the growth layer 20, for example, Si, Ge, GaN, AlN, InN, ZnS, ZnSe, CdTe, GaP, GaAs, InP, InAs, InSb, SiC, or the like can be adopted.

The combination of the material of the underlying substrate 10 and the material of the growth layer 20 can be appropriately selected in consideration of the difference in the lattice constant and the thermal expansion coefficient between both materials.

In the crystal growth step S20, as a growth method of the growth layer 20, a known vapor phase growth method (corresponding to a vapor phase epitaxial method) such as a physical vapor transport (PVT) method, a sublimation recrystallization method, an improved Rayleigh method, a chemical vapor transport (CVT) method, a molecular-organic vapor phase epitaxy (MOVPE) method, or a hydride vapor phase epitaxy (HVPE) method can be adopted. Furthermore, in the crystal growth step S20, a physical vapor deposition (PVD) can be adopted instead of PVT. Moreover, in the crystal growth step S20, a chemical vapor deposition (CVD) can be adopted instead of CVT. Then, in the crystal growth step S20, as a growth method of the growth layer 20, a known liquid phase growth method (corresponding to a liquid phase epitaxial method) such as a top-seeded solution growth (TSSG) method or a metastable solvent epitaxy (MSE) method can be adopted. In addition, in the crystal growth step S20, a Czochralski (CZ) method can be adopted as a growth method of the growth layer 20. In the crystal growth step S20, a growth method can be appropriately selected and adopted according to the respective materials of the underlying substrate 10 and the growth layer 20.

Figure 4:
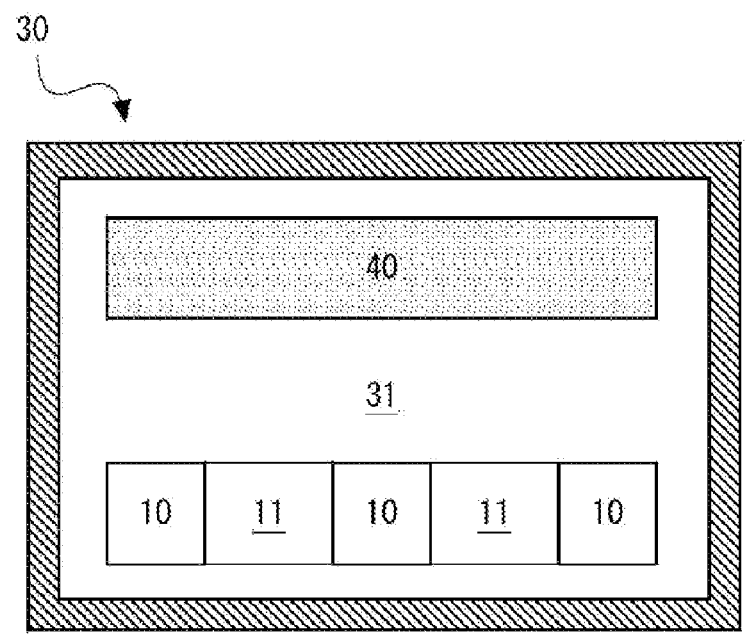
FIG. 4 is an explanatory view for explaining a crystal growth step according to the embodiment.
Figure 4:
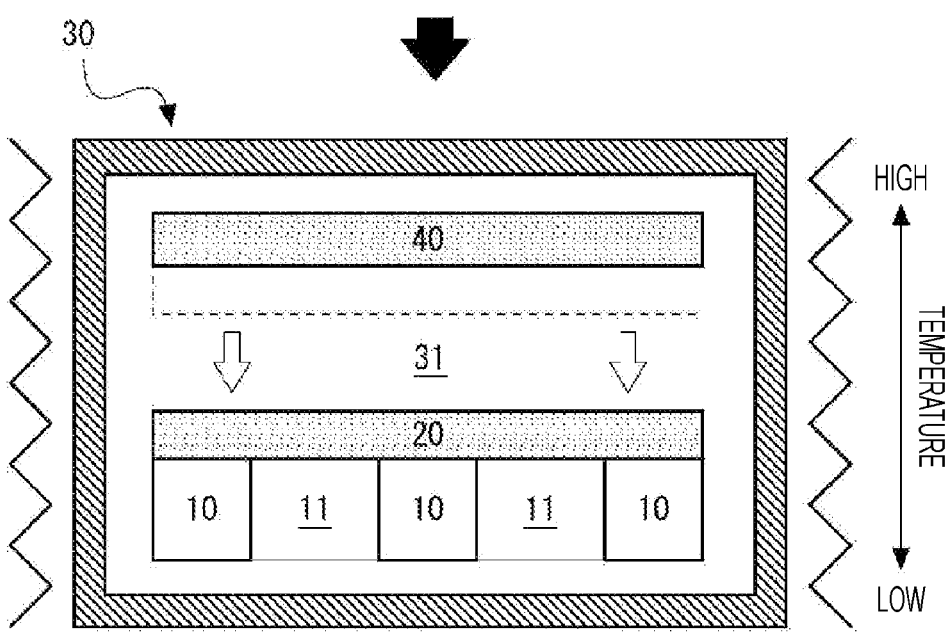

FIG. 4 is an explanatory view for explaining the crystal growth step S20 according to the embodiment.

The crystal growth step S20 according to the embodiment is a step in which the underlying substrate 10 and a semiconductor material 40 serving as a source of the growth layer 20 are disposed and heated in such a way as facing (confronting) each other in a crucible 30 having a quasi-closed space. Furthermore, the "quasi-closed space" in the present description refers to a space in which inside of the container can be evacuated but at least a part of the steam generated in the container can be confined.

Moreover, the crystal growth step S20 is a step of heating such that a temperature gradient is formed along a vertical direction of the underlying substrate 10. By heating the crucible 30 (the underlying substrate 10 and the semiconductor material 40) in this temperature gradient, the source is transported from the semiconductor material 40 onto the underlying substrate 10 via a source transport space 31.

As a driving force for transporting the source, the temperature gradient described above and a chemical potential difference between the underlying substrate 10 and the semiconductor material 40 can be adopted.

Specifically, in the quasi-closed space, vapor composed of an element sublimated from the semiconductor material 40 is transported by diffusing in the source transport space 31, and is supersaturated and condensed on the underlying substrate 10 set to have a temperature lower than that of the semiconductor material 40. Alternatively, it is supersaturated and condensed on the underlying substrate 10 having a lower chemical potential than the semiconductor material 40. As a result, the growth layer 20 is formed on the underlying substrate 10.

In this crystal growth step S20, an inert gas or a doping gas may be introduced into the source transport space 31 to control the doping concentration and growth environment of the growth layer 20.

In the present embodiment, the aspect in which the growth layer 20 is formed by the PVT method has been described, but any method capable of forming the growth layer 20 can be naturally adopted.

Temperature Lowering Step

The temperature lowering step S30 is a step of lowering the temperature of the underlying substrate 10 and the growth layer 20 heated in the crystal growth step S20.

In the temperature lowering step S30, the underlying substrate 10 and the growth layer 20 shrink according to their respective thermal expansion coefficients as the temperature becomes lower. At this time, when the semiconductor material and the doping concentration are different between the underlying substrate 10 and the growth layer 20, a difference occurs in the shrinkage rate.

Figure 8:
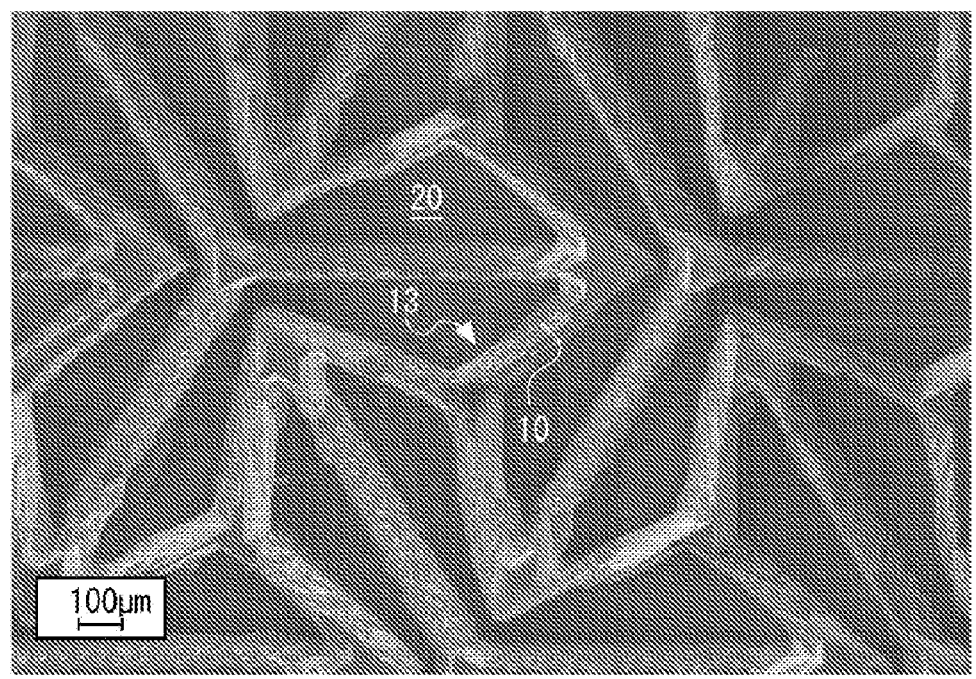
FIG. 8 is an explanatory view of a temperature lowering step according to Example 1.

According to the present embodiment, since the strength of the underlying substrate 10 is reduced in the embrittlement processing step S10, even when there is a difference in the shrinkage rate between the underlying substrate 10 and the growth layer 20, the underlying substrate 10 is deformed or cracks 13 are formed (see FIGS. 2 and 8).

In other words, the crystal growth step S20 according to the present invention is a step of forming the growth layer 20 having a shrinkage rate different from that of the underlying substrate 10. Specifically, it can be exemplified that the underlying substrate 10 and the growth layer 20 have different doping concentrations, and the underlying substrate 10 and the growth layer 20 are different materials.

In other words, the crystal growth step S20 according to the present embodiment is a step of forming the growth layer 20 having a doping concentration different from that of the underlying substrate 10. In addition, the crystal growth step S20 according to the present embodiment is a step of forming the growth layer 20 made of a material different from that of the underlying substrate 10.

According to the present invention, by including the embrittlement processing step S10 for reducing the strength of the underlying substrate 10, the stress generated between the underlying substrate 10 and growth layer 20 can be released to the underlying substrate 10, and occurrence of cracks in growth layer 20 can be suppressed.

As one aspect of the method for manufacturing a semiconductor substrate according to the present invention, an aspect in which AlN is grown on a SiC substrate as shown in the following examples is exemplified.

In addition, as one aspect of the method for manufacturing a semiconductor substrate according to the present invention, an aspect not including an aspect of growing AlN on the SiC substrate can be exemplified.

EXAMPLES

The present invention will be described more specifically with reference to Example 1 and Comparative Example 1.

Furthermore, in Example 1 and Comparative Example 1, the semiconductor substrate was manufactured by growing the growth layer 20 of AlN on the underlying substrate 10 of SiC.

AlN has a lattice mismatch with SiC of about 1% and a difference in thermal expansion coefficient from SiC of about 23%. In Example 1, the stress due to such lattice mismatch and the difference in thermal expansion coefficient is released to the SiC underlying substrate 10, thereby suppressing the occurrence of cracks in the growth layer 20 of AlN.

Example 1

Through Hole Formation Step S11

The underlying substrate 10 was irradiated with a laser under the following conditions to form the through holes 11.
(Underlying Substrate 10)
  Semiconductor material: 4H-SiC
  Substrate size: width 11 mm×length 11 mm×thickness 524 μm
  Growth surface: Si-face
  Off angle: on-axis
(Laser Processing Conditions)
  Type: green laser
  Wavelength: 532 nm
  Spot diameter: 40 μm
  Average output: 4 W (at 30 kHz)
(Pattern Details)

Figure 5:
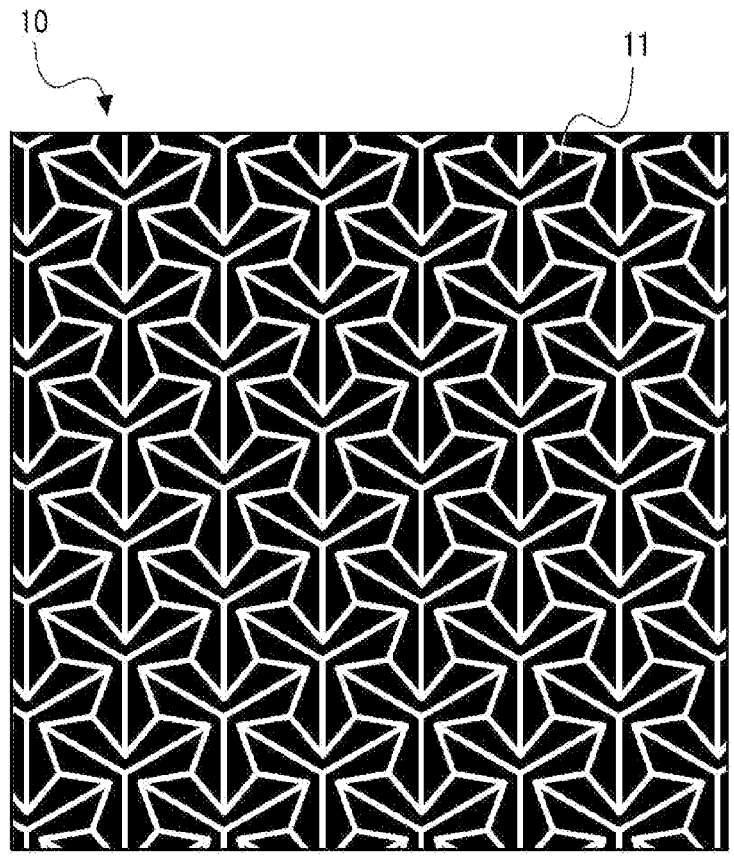
FIG. 5 is an explanatory view of a through hole formation step according to Example 1.
Figure 5:
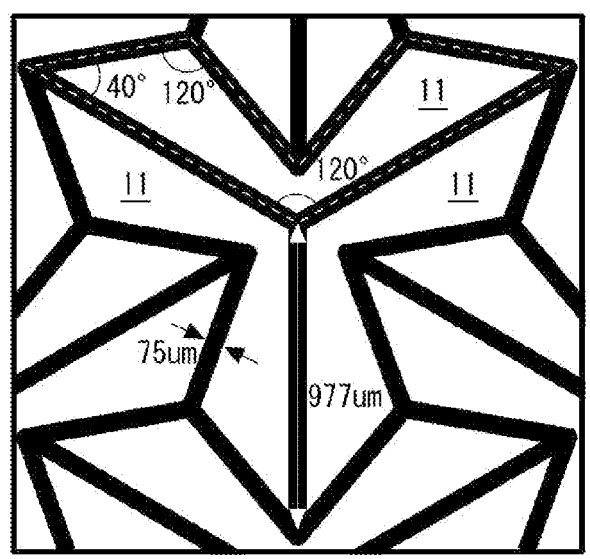

FIG. 5 is an explanatory view for explaining a pattern of the through holes 11 formed in the through hole formation step S11 according to Example 1. FIG. 5(a) is an explanatory view illustrating a state in which the plurality of through holes 11 is arranged. In FIG. 5(a), black regions indicate a portion of the through holes 11, and white regions remain as the underlying substrate 10.

FIG. 5(b) is an explanatory view illustrating a state in which the through holes 11 of FIG. 5(a) are enlarged. In FIG. 5(b), white regions indicate a portion of the through holes 11, and black regions remain as the underlying substrate 10.

Moreover, in the pattern of FIG. 5, 80% or more of the effective area of the underlying substrate 10 is removed to lower the strength of the underlying substrate 10.
(Strained Layer Removal Step S12)

Figure 6:
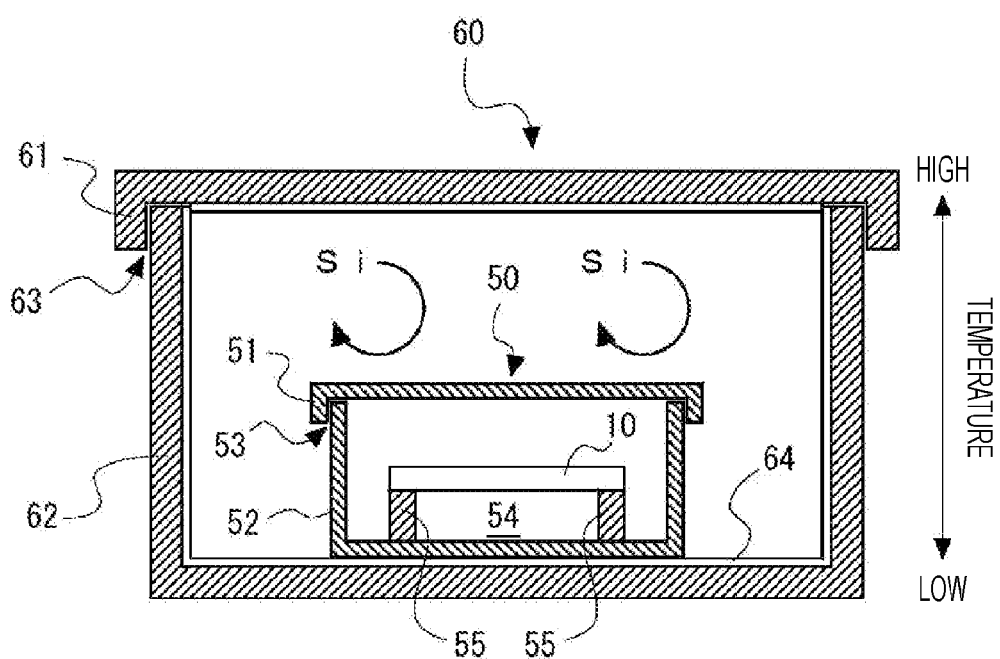
FIG. 6 is an explanatory view of a strained layer removal step according to Example 1.

FIG. 6 is an explanatory view for explaining the strained layer removal step S12 according to Example 1.

The underlying substrate 10 having the through holes 11 formed in the through hole formation step S11 was housed in a SiC container 50, the SiC container 50 was housed in a TaC container 60, and they were heated under the following conditions.
(Heating Conditions)
  Heating temperature: 1800° C.
  Heating time: 2 hours
  Etching amount: 8 μm
(SiC Container 50)
  Material: polycrystalline SiC
  Container size: diameter 60 mm×height 4 mm
  Distance between the underlying substrate 10 and bottom surface of the SiC
    container 50: 2 mm
(Details of SiC Container 50)

As illustrated in FIG. 6, the SiC container 50 is a fitting container including an upper container 51 and a lower container 52 that can be fitted to each other. A gap 53 is formed in a fitting portion between the upper container 51 and the lower container 52, and the SiC container 50 can be exhausted (evacuated) from the gap 53.

The SiC container 50 has an etching space 54 formed by making a part of the SiC container 50 arranged on the low temperature side of the temperature gradient face the underlying substrate 10 in a state where the underlying substrate 10 is arranged on the high temperature side of the temperature gradient. The etching space 54 is a space for transporting and etching Si atoms and C atoms from the underlying substrate 10 to the SiC container 50 using a temperature difference provided between the underlying substrate 10 and the bottom surface of the SiC container 50 as the driving force.

Furthermore, the SiC container 50 includes a substrate holder 55 that holds the underlying substrate 10 in a hollow state to form the etching space 54. In addition, the substrate holder 55 may not be provided depending on a direction of the temperature gradient of a heating furnace. For example, when the heating furnace forms a temperature gradient such that the temperature becomes lower from the lower container 52 toward the upper container 51, the underlying substrate 10 may be disposed on the bottom surface of the lower container 52 without providing the substrate holder 55.
(TaC Container 60)
Material: TaC
  Container size: diameter 160 mm×height 60 mm
  Si vapor supply source 64 (Si compound): TaSi$_2$
(Details of TaC Container 60)

Similarly to the SiC container 50, the TaC container 60 is a fitting container including an upper container 61 and a lower container 62 that can be fitted to each other, and is configured to be able to house the SiC container 50. A gap 63 is formed in a fitting portion between the upper container 61 and the lower container 62, and the TaC container 60 can be exhausted (evacuated) from the gap 63.

The TaC container 60 includes the Si vapor supply source 64 capable of supplying vapor pressure of a vapor phase type containing Si element into the TaC container 60. The Si vapor supply source 64 may be configured to generate vapor pressure of the vapor phase type containing Si element in the TaC container 60 during heat treatment.

Crystal Growth Step S20

Figure 7:
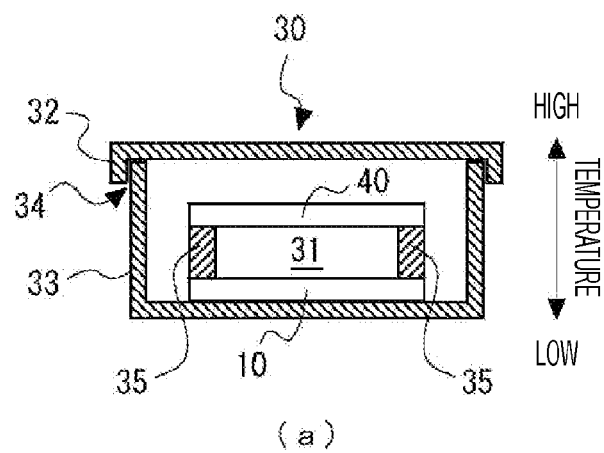
FIG. 7 is an explanatory view of a crystal growth step according to Example 1.
Figure 7:
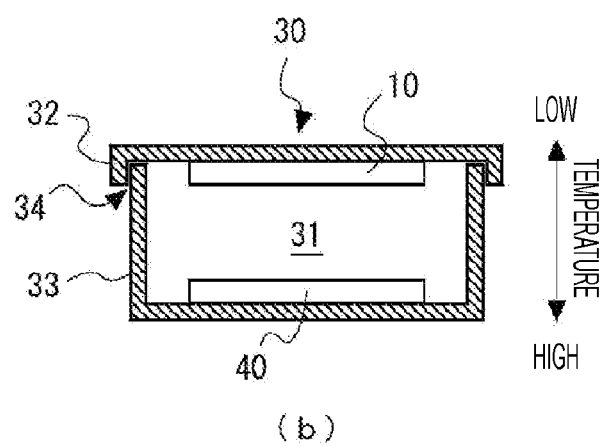
Figure 7:
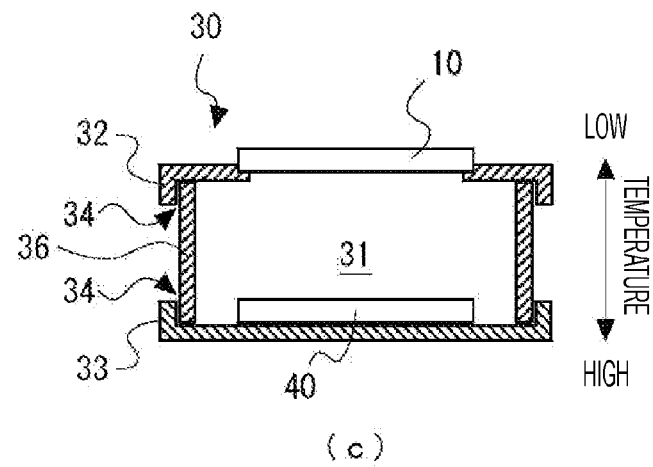

FIG. 7 is an explanatory view for explaining the crystal growth step S20 according to Example 1.

The underlying substrate 10 from which the strained layer 12 has been removed in the strained layer removal step S12 was housed in the crucible 30 while facing the semiconductor material 40, and was heated under the following conditions.

(Heating Conditions)
  Heating temperature: 2040° C.
  Heating time: 70 hours
  Growth thickness: 500 μm
  $N_2$ gas pressure: 10 kPa (Crucible 30)
  Material: tantalum carbide (TaC) and/or tungsten (W)
  Container size: 10 mm×10 mm×1.5 mm
  Distance between the underlying substrate 10 and the semiconductor material 40: 1 mm (Details of Crucible 30)

The crucible 30 has a source transport space 31 between the underlying substrate 10 and the semiconductor material 40. The source is transported from the semiconductor material 40 onto the underlying substrate 10 through the source transport space 31.

FIG. 7(a) is an example of the crucible 30 to be used in the crystal growth step S20. Similarly to the SiC container 50 and the TaC container 60, the crucible 30 is a fitting container including an upper container 32 and a lower container 33 that can be fitted to each other. A gap 34 is formed in a fitting portion between the upper container 32 and the lower container 33, and the crucible 30 can be exhausted (evacuated) from the gap 34.

Further, the crucible 30 includes a substrate holder 35 that forms the source transport space 31. The substrate holder 35 is provided between the underlying substrate 10 and the semiconductor material 40, and forms the source transport space 31 by arranging the semiconductor material 40 on the high temperature side and the underlying substrate 10 on the low temperature side.

FIGS. 7(b) and 7(c) are another example of the crucible 30 to be used in the crystal growth step S20. The temperature gradient in FIGS. 7(b) and 7(c) is set opposite to the temperature gradient in FIG. 7(a), and the underlying substrate 10 is disposed on an upper side. In other words, similarly to FIG. 7(a), the semiconductor material 40 is disposed on the high temperature side, and the underlying substrate 10 is disposed on the low temperature side to form the source transport space 31.

FIG. 7(b) illustrates an example in which the underlying substrate 10 is fixed to the upper container 32 side to form the source transport space 31 with the semiconductor material 40.

FIG. 7(c) illustrates an example in which the source transport space 31 is formed between the semiconductor material 40 and the underlying substrate 10 by forming a through window in the upper container 32 and arranging the underlying substrate 10. Furthermore, as illustrated in FIG. 7(c), an intermediate member 36 may be provided between the upper container 32 and the lower container 33 to form the source transport space 31.

(Semiconductor Material 40)
  Material: AlN sintered body
  Size: width 20 mm×length 20 mm×thickness 5 mm (Details of semiconductor material 40)

The AlN sintered body of the semiconductor material 40 was sintered in the following procedure.

The AlN powder was placed in a frame of a TaC block and compacted with an appropriate force. Thereafter, the compacted AlN powder and the TaC block were housed in a thermal decomposition carbon crucible and heated under the following conditions.

Heating temperature: 1850° C.
  $N_2$ gas pressure: 10 kPa
  Heating time: 3 hours Temperature Lowering Step Finally, the underlying substrate 10 and the growth layer 20 after the crystal growth step S20 were cooled under the following conditions.

(Temperature Lowering Conditions)
  Substrate temperature before temperature lowering: 2040° C.
  Substrate temperature after temperature lowering: room temperature
  Temperature lowering rate: 128° C./minute FIG. 7 is an SEM image of the underlying substrate 10 and the growth layer 20 cooled under the above conditions observed from the underlying substrate 10 side. It can be seen that the cracks 13 are formed in the underlying substrate 10.

In the underlying substrate 10 of the semiconductor substrate manufactured according to Example 1, a plurality of cracks 13 were observed. On the other hand, no cracks were observed in the growth layer 20. In other words, it was confirmed that there were no cracks in the entire region of 10 mm×10 mm on the AlN crystal growth surface (0001).

Comparative Example 1

The same underlying substrate 10 as in Example 1 was subjected to the crystal growth step S20 and the temperature lowering step S30 under the same conditions as in Example 1. In other words, in Comparative Example 1, the embrittlement processing step S10 was not performed, and the crystal growth step S20 was performed.

The cracks 13 were not observed in the underlying substrate 10 of the semiconductor substrate manufactured according to Comparative Example 1. On the other hand, in the growth layer 20, the cracks were observed at a crack linear density of 1.0 $mm^{-1}$. Moreover, the crack linear density in the present description refers to a value obtained by dividing a total length of all cracks observed in a measurement area by the measurement area (total length of cracks (mm)/measurement area ($mm^{-2}$)=crack linear density ($mm^{-1}$)).

From the results of Example 1 and Comparative Example 1, it can be understood that the stress generated in the growth layer 20 can be released to the underlying substrate 10 by reducing the strength of the underlying substrate 10 in the embrittlement processing step S10, and the occurrence of cracks in the growth layer 20 can be suppressed.

10 Underlying substrate
  11 Through hole
  12 Strained layer
  13 Crack
  20 Growth layer
  30 Crucible
  31 Source transport space
  40 Semiconductor material
  50 SiC container
  60 TaC container S10 Embrittlement processing step
S11 Through hole formation step
S12 Strained layer removal step
S20 Crystal growth step
S30 Temperature lowering step

The invention claimed is:

1. A method for manufacturing a semiconductor substrate, comprising:
an embrittlement processing step of reducing strength of an underlying substrate; and
a crystal growth step of forming a growth layer on the underlying substrate,
wherein the embrittlement processing step includes a through hole formation step of forming through holes in the underlying substrate;
wherein the underlying substrate is freestanding and the through holes allow airflow to pass through the underlying substrate;
wherein a ratio of an area occupied by the through holes to a surface of the underlying substrate on which the growth layer is formed is 50% or more; and
wherein the crystal growth step is a step of forming the growth layer having a shrinkage rate different from that of the underlying substrate.

2. The method for manufacturing a semiconductor substrate according to claim 1, wherein the underlying substrate and the growth layer have different doping concentrations.

3. The method for manufacturing a semiconductor substrate according to claim 1, wherein the underlying substrate and the growth layer are made of different materials.

4. The method for manufacturing a semiconductor substrate according to claim 1, wherein
the embrittlement processing step includes
a strained layer removal step of removing a strained layer introduced in the through hole formation step.

5. The method for manufacturing a semiconductor substrate according to claim 4, wherein the through hole formation step is a step of forming the through holes by irradiating the underlying substrate with a laser.

6. The method for manufacturing a semiconductor substrate according to claim 4, wherein the strained layer removal step is a step of removing a strained layer of the underlying substrate by heat treatment.

7. The method for manufacturing a semiconductor substrate according to claim 4, wherein
the underlying substrate is silicon carbide, and
the strained layer removal step is a step of etching the underlying substrate under a silicon atmosphere.

8. The method for manufacturing a semiconductor substrate according to claim 1, wherein the crystal growth step is a step of growing via a physical vapor transport method.

9. A method for suppressing occurrence of cracks in a growth layer, comprising an embrittlement processing step of reducing strength of an underlying substrate before forming the growth layer having a shrinkage rate different from that of the underlying substrate on the underlying substrate,
wherein the embrittlement processing step includes a through hole formation step of forming through holes in the underlying substrate;
wherein the underlying substrate is freestanding and the through holes allow airflow to pass through the underlying substrate; and
wherein a ratio of an area occupied by the through holes to a surface of the underlying substrate on which the growth layer is formed is 50% or more.

10. The method according to claim 9, wherein the embrittlement processing step includes
a strained layer removal step of removing a strained layer introduced in the through hole formation step.

11. The method according to claim 10, wherein the strained layer removal step is a step of etching the underlying substrate by heat treatment.

12. The method according to claim 10, wherein
the underlying substrate is silicon carbide, and
the strained layer removal step is a step of etching the underlying substrate under a silicon atmosphere.

* * * * *